(12) United States Patent
Cao et al.

(10) Patent No.: US 10,143,078 B2
(45) Date of Patent: Nov. 27, 2018

(54) SUPPORT DEVICE FOR PRINTED CIRCUIT BOARD

(71) Applicant: BOE Technology Group Co., Ltd., Beijing (CN)

(72) Inventors: Lei Cao, Beijing (CN); Nannan Hu, Beijing (CN); Zifeng Wang, Beijing (CN); She Lin, Beijing (CN); Yan Ren, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/522,945

(22) PCT Filed: Apr. 12, 2016

(86) PCT No.: PCT/CN2016/079047
§ 371 (c)(1),
(2) Date: Apr. 28, 2017

(87) PCT Pub. No.: WO2017/133078
PCT Pub. Date: Aug. 10, 2017

(65) Prior Publication Data
US 2018/0070445 A1   Mar. 8, 2018

(30) Foreign Application Priority Data

Feb. 2, 2016   (CN) .................... 2016 2 0106211 U

(51) Int. Cl.
*H05K 7/10* (2006.01)
*H05K 7/12* (2006.01)
(Continued)

(52) U.S. Cl.
CPC ..... *H05K 1/0278* (2013.01); *G02F 1/133308* (2013.01); *H05K 1/0216* (2013.01);
(Continued)

(58) Field of Classification Search
CPC ............... H05K 1/0278; H05K 9/0081; G02F 1/133308; G02F 2001/133314; G02F 2201/133334
(Continued)

(56) References Cited

U.S. PATENT DOCUMENTS 6,239,977 B1 *   5/2001   Price .................... H01C 1/1406
                                                337/297
7,488,902 B2 *   2/2009   English ................ H05K 9/0032
                                                174/377
(Continued)

FOREIGN PATENT DOCUMENTS

CN        2657345 Y      11/2004
CN       202143348 U      2/2012
(Continued)

OTHER PUBLICATIONS

International Search Report and Written Opinion, including English translation of Box No. V of the Written Opinion, for International Application No. PCT/CN2016/079047, dated Nov. 9, 2016, 13 pages.

*Primary Examiner* — Hung S Bui
(74) *Attorney, Agent, or Firm* — Westman, Champlin & Koehler, P.A.

(57) ABSTRACT

A support device for a printed circuit board includes a plate body and a shielding cover formed integrally with the plate body, the plate body is provided with an opening and a mounting structure for mounting a printed circuit board, the shielding cover is formed from an extension of a side wall of the opening and covers the printed circuit board.

18 Claims, 2 Drawing Sheets

(51) Int. Cl.
    *H05K 1/02*      (2006.01)
    *G02F 1/1333*    (2006.01)
    *H05K 9/00*      (2006.01)
(52) U.S. Cl.
    CPC ......... *H05K 9/0026* (2013.01); *H05K 9/0081* (2013.01); *G02F 2001/133314* (2013.01); *G02F 2001/133334* (2013.01); *H05K 2201/10371* (2013.01)
(58) Field of Classification Search
    USPC ........................................................ 361/770
    See application file for complete search history.

(56) References Cited

U.S. PATENT DOCUMENTS

| | | | | |
|---|---|---|---|---|
| 7,626,832 B2* | 12/2009 | Muramatsu | ......... | H05K 9/0069 361/816 |
| 8,149,594 B2* | 4/2012 | Nishihata | ............... | H05K 9/002 174/250 |
| 8,587,960 B2* | 11/2013 | Hwang | ................ | H05K 5/02 361/799 |
| 9,179,582 B2* | 11/2015 | Chang | ................. | H05K 5/0247 |
| 2010/0158633 A1* | 6/2010 | Huang | ................... | F16B 5/065 411/25 |

FOREIGN PATENT DOCUMENTS

| | | |
|---|---|---|
| CN | 102384443 A | 3/2012 |
| CN | 204392768 U | 6/2015 |

* cited by examiner

SUPPORT DEVICE FOR PRINTED CIRCUIT BOARD

CROSS-REFERENCE TO RELATED APPLICATION

This application is a Section 371 National Stage Application of International Application No. PCT/CN2016/079047, filed Apr. 12, 2016, entitled "SUPPORT DEVICE FOR PRINTED CIRCUIT BOARD", which claims priority to Chinese Application No. 201620106211.8, filed on Feb. 2, 2016, incorporated herein by reference in their entirety.

BACKGROUND

Technical Field

Embodiments of the present disclosure relate to a field of liquid crystal display devices, and more particularly to a support device for a printed circuit board.

Description of the Related Art

A printed circuit board is a common electronic component, which is widely used in a variety of electronic products as a medium for electrical connection between electronic elements. A common electronic product usually includes at least one printed circuit board, and each printed circuit board is equipped with electronic elements. When the electronic product works, each electronic element on the printed circuit board will generate electromagnetic wave radiation outwardly, resulting in electromagnetic interference between the various electronic elements on the printed circuit board and further affecting normal work of the electronic products.

In order to address this issue, the printed circuit board is currently usually mounted to a back plate and a shielding cover is mounted to the back plate. The shielding cover includes an outer shielding body and a mounting plate which is fixedly connected to the outer shielding body, the outer shielding body is fixed mounted to the back plate by means of the mounting plate and a rivet assembly and covers the printed circuit board, so as to avoid the electromagnetic interference between the various electronic elements on the printed circuit board. Since such a solution requires providing an additional shielding cover on the back plate, it is limited by installation processes and a thickness of the shielding cover is required to be large enough for easy installation. Thus, the shielding cover will inevitably increase a thickness of the electronic product, adversely affecting lightweight and thin design of the electronic product.

SUMMARY

In order to at least partially solve the above problem, i.e., the increase of the thickness of the electronic product due to the addition of a shielding cover on the back plate, the embodiments of the present disclosure provides a support device for a printed circuit board. The detailed technical solution is as follows:

A support device for a printed circuit board, comprising a plate body and a shielding cover formed integrally with the plate body, wherein, the plate body is provided with an opening and a mounting structure for mounting the printed circuit board, and the shielding cover is formed from an extension of a side wall of the opening and covers the printed circuit board.

In an exemplary embodiment of the present disclosure, the shielding cover comprises a top plate and at least one side plate, a bottom edge of the side plate is connected to the plate body, and a top edge of the side plate is connected to the top plate.

In an exemplary embodiment of the present disclosure, a thickness of the top plate ranges from 2 mm to 3 mm.

In an exemplary embodiment of the present disclosure, a minimum distance between the top plate and an electronic element provided on the printed circuit board is at least 0.2 mm.

In an exemplary embodiment of the present disclosure, the mounting structure comprises a riveting seat and a riveting stud inserted in the riveting seat, and the printed circuit board is mounted to the plate body by means of the riveting seat and the riveting stud.

In an exemplary embodiment of the present disclosure, the shielding cover comprises one side plate, which is located between two riveting seats, and a length of the side plate in a direction from one riveting seat to the other riveting seat is less than a spacing between the two riveting seats.

In an exemplary embodiment of the present disclosure, the shielding cover comprises two side plates, which are arranged in parallel with each other, and two riveting seats are provided between the two side plates.

In an exemplary embodiment of the present disclosure, notches are respectively provided in the two side plates at positions corresponding to the two riveting seats, and mounting lugs corresponding to the respective notches are provided on the plate body, the mounting lugs being associated with the notches.

In an exemplary embodiment of the present disclosure, mounting holes are provided in the top plate at positions corresponding to the two riveting seats respectively.

In an exemplary embodiment of the present disclosure, the shielding cover is of a hood-shaped structure formed by punching the plate body.

In an exemplary embodiment of the present disclosure, the plate body and the shielding cover each forms a structure made from aluminum.

In an exemplary embodiment of the present disclosure, the plate body is a back plate for supporting a printed circuit board of a liquid crystal display device.

BRIEF DESCRIPTION OF THE DRAWINGS

In order to more clearly describe the technical solutions in the embodiments of the present disclosure, the following drawings, which are intended to illustrate the embodiments, will be briefly described below. It will be apparent that the drawings in the following description are merely exemplary embodiments of the present disclosure, Other drawings may be obtained for those skilled in the art according to these drawings, without inventive work.

REFERENCE NUMERAL

1—plate body, 11—opening, 12—mounting lug, 2—shielding cover, 21—top plate, 22—side plate, 23—notch, 24—mounting hole, 3—printed circuit board, 31—electronic element, 4—mounting structure, 41—riveting seat.

DETAILED DESCRIPTION OF PREFERRED EMBODIMENTS

In order that the objects, solutions and advantages of the present disclosure become more apparent, the embodiments of the present disclosure will be further described in detail below, in conjunction with the accompanying drawings.

EXAMPLE

Figure 1:
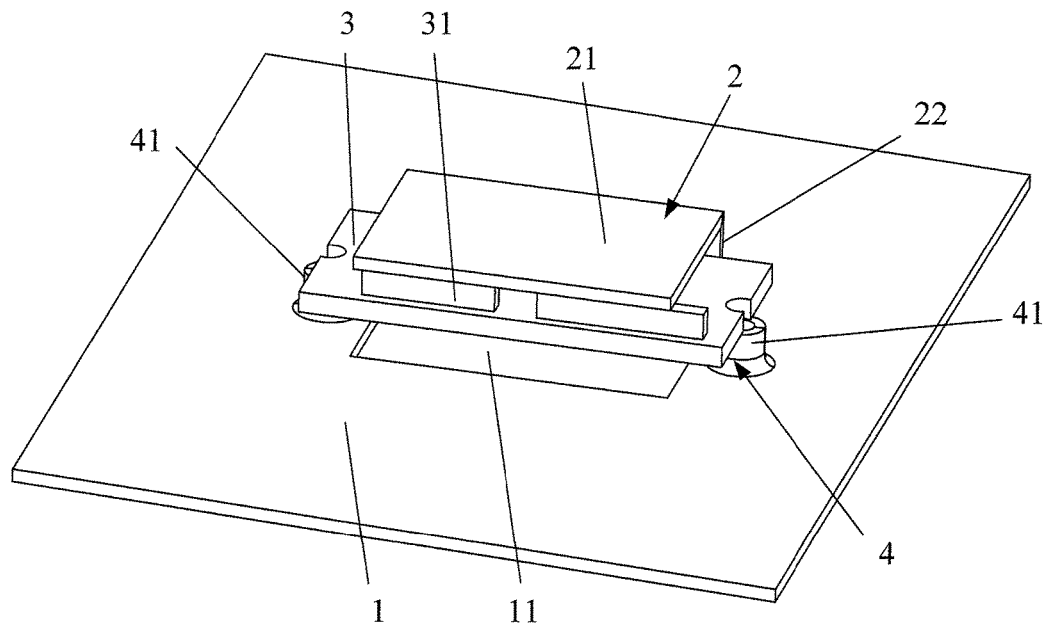
FIG. 1 is a schematic structural view of a support device according to an embodiment of the present disclosure.

There is provided a support device for a printed circuit board in an embodiment of the present disclosure, as shown in FIG. 1, the support device comprises a plate body 1 and a shielding cover 2 formed integrally with the plate body 1, the plate body 1 is provided with an opening 11 and a mounting structure 4 for mounting a printed circuit board 3, the shielding cover 2 is formed from an extension of a side wall of the opening and covers the printed circuit board 3.

It should be noted that, in the embodiment of the present disclosure, the shielding cover 2 covering the printed circuit board 3 means that at least a partial area of the printed circuit board 3 is located between a projection surface of the shielding cover 2 onto the plate body 1 and the shielding cover 2, especially an area of the printed circuit board 3 provided with electronic elements 31.

In the embodiment, by means of the support device including the plate body 1 and the shielding cover 2, the printed circuit board 3 may be mounted to the plate body 1 and the shielding cover 2 covers the printed circuit board 3, thereby avoiding interfering in the electronic elements 31 on the printed circuit board 3. Since the shielding cover 2 is formed integrally with the plate body 1, it is not necessary to mount an additional shielding cover 2 to the plate body 1. As a result, processes of mounting the shielding cover 2 may be omitted and a thickness of the shielding cover 2 may be relatively smaller, thereby achieving a lightweight and thin electronic product.

In the present embodiment, the plate body 1 may be a back plate for supporting the printed circuit board 3 of a liquid crystal display device, and specifically, the liquid crystal display device may be a liquid crystal television, a liquid crystal display, or the like.

Optionally, the plate body 1 and the shielding cover 2 each forms a structure made from aluminum, so as to further lighten and thin the shielding cover 2.

In the embodiment shown in FIG. 1, the shielding cover 2 comprises a top plate 21 and one side plate 22, a bottom edge of the side plate 22 is connected to the plate body 1, and a top edge of the side plate 22 is connected to the top plate 21. Specifically, the shielding cover 2 is divided into two connected portions, the top plate 21 and the side plate 22, the top plate 21 is arranged above the printed circuit board 3, and the side plate 22 is arranged at a side of the printed circuit board 3. In this way, it is possible for the shielding cover 2 to cover the printed circuit board 3 by means of a relatively simple structure, so as to provide a function of anti-electromagnetic interference.

Optionally, the shielding cover 2 is of a hood-shaped structure formed by punching the plate body 1. In this way, the shielding cover 2 has a relatively small thickness, so as to lighten and thin the shielding cover 2. Moreover, the punch forming process is of a low production cost, the product quality uniformity by this process may be ensured, therefore this process is suitable for producing products of large output, such as liquid crystal display devices. In the actual punch forming process, the thickness of the top plate 21 of the shielding cover is less than the thickness of the plate body 1 by 0.15 mm to 0.5 mm.

Figure 2:
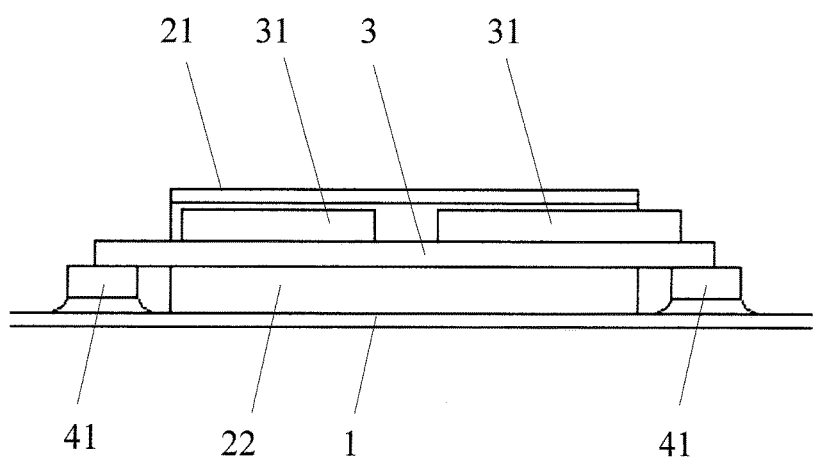
FIG. 2 is a front view of a support device according to an embodiment of the present disclosure.

FIG. 2 is a front view of the support device. As shown in FIG. 2, optionally, the top plate 21 may be parallel to the printed circuit board 3, and the side plate 22 is perpendicular to the top plate 21, so as to save an installation space for the shielding cover 2 and further lighten and thin the support device.

Further, a minimum distance between the top plate 21 and an electronic element 31 provided on the printed circuit board 3 is at least 0.2 mm, so that a relatively sufficient installation space for the printed circuit board 3 is provided, thereby avoiding damaging the electronic element 31 on the printed circuit board 3 when the printed circuit board 3 is mounted.

In the present embodiment, the mounting structure 4 comprises a riveting seat 41 and a riveting stud inserted in the riveting seat 41, and the printed circuit board 3 is mounted to the plate body 1 by means of the riveting seat 41 and the riveting stud, which functions to fix and mount the printed circuit board 3. It should be noted that, in other embodiments, the mounting structure 4 is not limited to the combination of fastener types of the riveting seat 41 and the riveting stud, but any combination of other fastener types, for example, bolt and bolt seat, etc., which are not limited in the present disclosure.

Referring again to FIG. 1, in the present embodiment, if the shielding cover 2 comprises one side plate 22, then the side plate 22 located between two riveting seats 21, and a length of the side plate 22 in a direction from one riveting seat 41 to the other riveting seat 42 is less than a spacing between the two riveting seats 41. Since the shielding cover 2 has only one side plate 22, the shielding cover 2 in this case is relatively simple, thus the manufacturing difficulty of the support device is reduced. In this case, the printed circuit board 3 has a relatively large installation space, thus the mounting difficulty of the printed circuit board 3 may be reduced.

Figure 3:
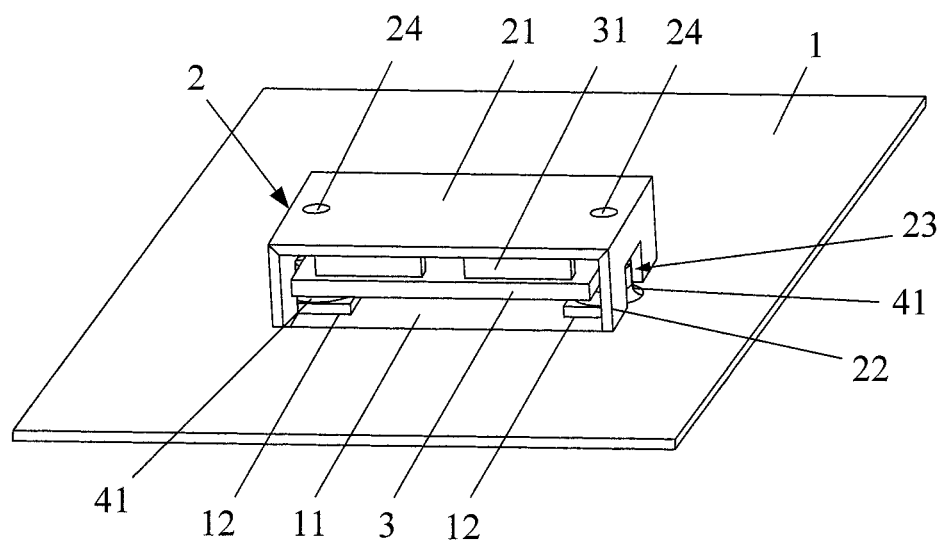
FIG. 3 is a schematic structural view of a support device in which a shielding cover comprises two side plates according to an embodiment of the present disclosure.

FIG. 3 is a schematic structural view of a support device in which a shielding cover comprises two side plates. As shown in FIG. 3, if the shielding cover 2 comprises two side plates 22, then the two side plates 22 are arranged in parallel with each other, and the two side plates 22 are located at two longitudinal ends of the shielding cover 2, two riveting seats 41 each may be provided between the two side plates 22. Since the shielding cover 2 has two side plates 22, the shielding cover 2 can shield a relatively larger area of the printed circuit board 3. Therefore, the shielding cover 2 in this case has a higher ability of anti-electromagnetic interference, and is suitable for use in the liquid crystal display device, which raises a high requirement for anti-electromagnetic interference.

In the present embodiment, notches 23 are respectively provided in the two side plates 22 at positions corresponding to the two riveting seats 41, and mounting lugs 12 corresponding to the respective notches 23 are provided on the plate body 1, the mounting lugs 12 are associated with the notches 23. In the above-described embodiment, when the plate body 1 is punched, the plate body 1 is partially protruded outwardly to form the shielding cover 2 under the action of a punching machine, and the opening 11 corresponding to the shielding cover 2 is formed in the plate body 1. During the formation of the shielding cover 2, the riveting seat 41 is moved relative to the side plate 22 of the shielding cover 2, the riveting seat 41 is moved to an inner side of the side plate 22 from an outer side of the side plate 22 through the notch 23. The notch 23 avoids intervene between the shielding cover 2 and the riveting seat 41 during the punch forming. Since the shielding cover 2 is formed by punching the plate body 1, the mounting lugs 12 corresponding to and associated with the notches 23 of the shielding cover are formed on the plate body 1 after the punching of the plate body 1 is completed. The mounting lugs 12 are arranged in parallel with the top plate 21, and the two riveting seat 41 may be provided on the two mounting lugs 12, respectively.

Specifically, mounting holes 24 are provided in the top plate 21 at positions corresponding to the two riveting seats 41 respectively, the mounting holes 24 allow the riveting studs to be inserted into the riveting seats 41. In the above-described embodiment, the printed circuit board 3 may be inserted into the support device through a gap between the riveting seats 41 and the top plate 21, the riveting studs may pass through the printed circuit board 3 from the mounting holes 24 and be inserted into the riveting seats 41, thereby positioning and mounting the printed circuit board 3. It should be understood that, if the mounting structure 4 is made of bolts and bolt seats, the bolts may pass through the printed circuit board 3 from the mounting holes 24 and be inserted into the bolt seats, and then a fastening tool corresponding to the bolts may pass through the mounting holes 24 and tighten the bolts.

The technical solutions according to the embodiments of the disclosure bring the following beneficial effects:

By means of the support device including the plate body and the shielding cover, the printed circuit board may be mounted to the plate body and the shielding cover covers the printed circuit board, thereby avoiding interfering in electronic elements on the printed circuit board. Since the shielding cover is formed integrally with the plate body, it is not necessary to mount an additional shielding cover to the plate body. As a result, processes of mounting the shielding cover may be omitted and a thickness of the shielding cover may be relatively smaller, thereby achieving a lightweight and thin electronic product.

The above description merely presents optional embodiments of the present disclosure, and is not intended to limit the disclosure. Any modifications, equivalent substitutions, improvements, and the like within the spirit and principle of the present disclosure all fall into the scope of the present disclosure.

What is claimed is:

1. A support device for a printed circuit board, comprising a plate body and a shielding cover formed integrally with the plate body, wherein, the plate body is provided with an opening and a mounting structure for mounting the printed circuit board, and the shielding cover is formed from an extension of a side wall of the opening and covers the printed circuit board; and
   wherein the shielding cover comprises a top plate and at least one side plate, a bottom edge of the side plate is connected to the plate body, and a top edge of the side plate is connected to the top plate.

2. The support device according to claim 1, wherein a thickness of the top plate ranges from 2 mm to 3 mm.

3. The support device according to claim 2, wherein the shielding cover is of a hood-shaped structure formed by punching the plate body.

4. The support device according to claim 1, wherein a minimum distance between the top plate and an electronic element provided on the printed circuit board is at least 0.2 mm.

5. The support device according to claim 4, wherein the shielding cover is of a hood-shaped structure formed by punching the plate body.

6. The support device according to claim 1, wherein the mounting structure comprises a riveting seat and a riveting stud inserted in the riveting seat, and the printed circuit board is mounted to the plate body by means of the riveting seat and the riveting stud.

7. The support device according to claim 6, wherein the shielding cover comprises one side plate, which is located between two riveting seats, and a length of the side plate in a direction from one riveting seat to the other riveting seat is less than a spacing between the two riveting seats.

8. The support device according to claim 7, wherein the shielding cover is of a hood-shaped structure formed by punching the plate body.

9. The support device according to claim 6, wherein the shielding cover comprises two side plates, which are arranged in parallel with each other, and two riveting seats are provided between the two side plates.

10. The support device according to claim 9, wherein notches are respectively provided in the two side plates at positions corresponding to the two riveting seats, and mounting lugs corresponding to the respective notches are provided on the plate body, the mounting lugs being associated with the notches.

11. The support device according to claim 10, wherein the shielding cover is of a hood-shaped structure formed by punching the plate body.

12. The support device according to claim 9, wherein mounting holes are provided in the top plate at positions corresponding to the two riveting seats respectively.

13. The support device according to claim 12, wherein the shielding cover is of a hood-shaped structure formed by punching the plate body.

14. The support device according to claim 9, wherein the shielding cover is of a hood-shaped structure formed by punching the plate body.

15. The support device according to claim 6, wherein the shielding cover is of a hood-shaped structure formed by punching the plate body.

16. The support device according to claim 1, wherein the shielding cover is of a hood-shaped structure formed by punching the plate body.

17. The support device according to claim 1, wherein the plate body and the shielding cover each forms a structure made from aluminum.

18. The support device according to claim 1, wherein the plate body is a back plate for supporting a printed circuit board of a liquid crystal display device.

* * * * *